United States Patent
Auer et al.

(10) Patent No.: US 12,235,324 B2
(45) Date of Patent: Feb. 25, 2025

(54) FORCE MEASUREMENT MODULE FOR CAPTURING A FORCE, AND METHOD FOR DETERMINING A FORCE

(71) Applicant: Lisa Draexlmaier GmbH, Vilsbiburg (DE)

(72) Inventors: Christian Auer, Eichendorf (DE); Michael Römelsberger, Massing (DE); Josef Grosse Krabbe, Munich (DE); Stefan Kollmer, Falkenberg (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 62 days.

(21) Appl. No.: 17/957,405

(22) Filed: Sep. 30, 2022

(65) Prior Publication Data

US 2023/0033261 A1 Feb. 2, 2023

Related U.S. Application Data

(63) Continuation of application No. PCT/EP2021/058400, filed on Mar. 31, 2021.

(30) Foreign Application Priority Data

Apr. 7, 2020 (DE) .................... 10 2020 109 679.8

(51) Int. Cl.
*G01R 31/385* (2019.01)
(52) U.S. Cl.
CPC ............................... *G01R 31/3865* (2019.01)
(58) Field of Classification Search
CPC ............ G01R 31/3865; H01M 50/249; H01M 50/204; H01M 2220/20; G01L 5/008
See application file for complete search history.

(56) References Cited

U.S. PATENT DOCUMENTS

| | | |
|---|---|---|
| 6,742,472 B1 | 6/2004 | Shigyo |
| 9,793,581 B2 | 10/2017 | Henrici et al. |
| 11,121,424 B2 | 9/2021 | Schuessler et al. |
| 2021/0344061 A1 | 11/2021 | Roemelsberger et al. |

FOREIGN PATENT DOCUMENTS

| | | | | |
|---|---|---|---|---|
| CN | 109449519 | | 3/2019 | |
| CN | 112180270 A | * | 1/2021 | ............... G01K 1/14 |
| CN | 116147815 A | * | 5/2023 | |
| DE | 102012207999 A1 | * | 11/2013 | ........... G01L 9/0001 |
| DE | 102017223664 | | 6/2019 | |
| JP | 2007234436 A | * | 9/2007 | |
| WO | WO-2010037559 A1 | * | 4/2010 | ............. G01L 5/008 |

OTHER PUBLICATIONS

European Patent Office, International Search Report for PCT/EP2021/058400, Jun. 16, 2021.

* cited by examiner

*Primary Examiner* — Christopher E Mahoney
(74) *Attorney, Agent, or Firm* — Burris Law, PLLC (57) ABSTRACT

A force measurement module for determining of a force when installing a battery module into a battery housing includes a housing having a shape and external dimensions substantially of the battery module and at least one force sensor arranged in the housing. The at least one force sensor is configured to determine a force when installing the housing into the battery housing. Furthermore, a method for determining a force when installing a battery module into a battery housing is provided.

9 Claims, 5 Drawing Sheets

FORCE MEASUREMENT MODULE FOR CAPTURING A FORCE, AND METHOD FOR DETERMINING A FORCE

CROSS-REFERENCE TO RELATED APPLICATIONS

This application is a continuation of International Application No. PCT/EP2021/058400, filed on Mar. 31, 2021, which claims priority to and the benefit of German Patent Application No. DE 10 2020 109 679.8, filed on Apr. 7, 2020. The disclosures of the above application is incorporated herein by reference.

FIELD

The present disclosure relates to a force measurement module to determine at least one force when installing a battery module into a battery housing. Furthermore, the present disclosure relates to a method for determining at least one force when installing a battery module into the battery housing.

BACKGROUND

The statements in this section merely provide background information related to the present disclosure and may not constitute prior art.

In the assembly of battery modules in a battery housing of a battery, the battery modules are installed into a battery frame and assembled. Next, the battery housing is sealed, usually by screwing or welding on of a cover. The battery modules comprise a nesting of individual battery cells. During operation of the battery, heat is produced in the battery cells which must be dissipated; in particular through the battery housing. Thus, before assembly of the battery modules into the battery housing on the battery frame, a heat conducting paste is applied which increases or provides the thermal conductance between the battery module and the battery housing. Then the battery modules are pressed onto the battery frame, wherein the pasty heat conducting paste is partially displaced, and then the battery modules are screwed to the battery frame. In the assembly, during the pressing and screwing of the battery module, large assembly forces are produced, which at present can be measured by means of a pressure measurement foil, such as for example a Fuji Film foil as per U.S. Pat. No. 6,742,472 B1, wherein with the pressure measurement foil only the total forces occurring during the pressing or during the screwing of the battery module are measurable. In order to evaluate the measured forces, a user must again remove the battery module from the battery housing and assess the intensities of the discolorations on the individual pressure measurement foils, wherein the discolorations correspond to the total forces during the pressing and screwing of the battery module. Thus, by means of the pressure measurement foils it is not possible to measure a chronological force profile during the pressing or screwing of the battery module. Subsequently the battery module is reinstalled into the battery housing, and based on the total forces determined by means of the pressure measurement foil, is screwed down so that the internal stresses in the battery cells of the battery module and of the battery frame are reduced to a minimum and thus a long service life of the battery module is assured.

For example, German Patent Application No. DE 10 2019 101 403 describes a method for determining of at least one section of a battery module and of one section of the battery housing by means of a determination of the size and shape of a gap which is produced in the proper installed position of the battery module. Next, a quantity of a heat conducting material is determined on the basis of the determined size and shape of the gap, and is then installed into the battery housing. This provides that when installing the battery module into the battery housing, the improved quantity of heat conducting material is present and thus the forces are reduced when pressing and screwing the battery module in the battery housing.

Since this conventional method for evaluating of the total forces during the pressing and screwing of the battery module onto the battery frame of the battery housing is quite time-consuming within the scope of the production process, at present the forces occurring during the final screwing of the cover onto the battery housing are not taken into account.

SUMMARY

This section provides a general summary of the disclosure and is not a comprehensive disclosure of its full scope or all of its features.

In one form, the present disclosure provides an improved force measurement during the assembly process of battery modules in a battery housing, while using the simplest possible design.

One aspect of the present disclosure relates to a force measurement module for determining of a force when installing a battery module into a battery housing, with a housing which features essentially the external dimensions of the battery module and at least one force sensor which is arranged in the housing and is designed to determine a force when installing the housing into the battery housing. When installing the housing into the battery housing, the force measurement module is pressed, in one variation, into a battery compartment of the battery housing. This generates forces which are measured by the force sensor. In one variation, a chronological force profile during the pressing can be measured by the force sensors. The force measurement module according to the present disclosure is used as a kind of replacement for the actual battery module to be installed during a first pressing and screwing process, so that the occurring forces, and in one form their chronological profile, can be measured more accurately by the force sensor in comparison to conventional methods. Accordingly, the force measurement module can be easily removed from the battery housing again and the measured forces can be easily read off and used within the scope of the production process. The use of a pressure measurement foil according to the present method is thus likewise no longer desired. After the removal of the force measurement module, the corresponding battery module can be finally installed into the battery housing, and can be finally pressed down and screwed on under consideration of the forces measured by means of the force measurement module, wherein the occurring interior stresses within the battery cells within the particular battery module of the battery housing are reduced.

The force measurement module comprises a cover, a middle part and a base surface. In addition, the force measurement module comprises a measurement amplifier. The measurement amplifier can be connected to a data processing unit by means of a wireless interface, and allows an enhanced measurement accuracy of the force sensors, so that the values measured by the force sensors can be better analyzed. In one variation, the measurement amplifier can be arranged at the middle part of the force measurement module. The middle part can likewise feature a flip switch to switch the force measurement module on and off, a replaceable storage battery for electrical energy supply, and a heat exchanger to dissipate the heat from the force measurement module. The cover shields the force measurement module against damage and contamination. The force measurement module is designed in one aspect as an autarkic system with separate power supply and separate measurement system, so that a continual use of the force measurement module is possible within the scope of the production process.

Since the shapes and external dimensions of the individual battery modules vary within certain tolerances, it is additionally proposed to survey the individual battery module with respect to its shape and external dimensions, and to adapt the shape and the external dimensions of the housing of the force measurement module to the shape and external dimensions of the particular battery module to be employed. In this regard bars are arranged in one aspect in the bottom, in the cover and/or in the side walls of the force measurement module; these bars can be connected to corresponding mounts and attachments on the side walls in the bottom and/or in the cover of the force measurement module, and thus allow, in a flexible manner, the adaptation to different shapes and external dimensions of the housing of the force measurement module. The adjustment of the shape and of the external dimensions of the housing can proceed manually by means of an operator by locking the mounts onto the particular bars and/or by means of an electric servo-motor using an electrical control.

This provides that the forces and force-changes measured by the force measurement module actually and very accurately reflect the forces and force-changes during the subsequent pressing or screwing of the associated battery module in the battery housing and/or during the screwing of the cover onto the battery housing. Due to an accurate knowledge of the expected forces and force-changes during the pressing and screwing, the pressing and screwing forces of the associated battery module are accurately determined and applied in advance. Due to the use of the needed pressing and screwing forces when installing the battery module, the interior stresses within the battery module and within the battery housing are reduced to a minimum and thus the service life of the battery is extended.

Several force sensors are arranged on the housing and/or within the force measurement module so as to measure the force at several locations. In order to obtain precise measured values, the arrangement of the force sensors can be selected so that the force measurement module is statically defined. A resulting force can then be calculated by means of a center of mass of the force measurement module. To reduce measurement errors, in one variation, the force sensors can be arranged in one form a surface-covering triangle.

Alternatively, the force sensors can be arranged at force-sensitive points within the force module. In one variation, the present disclosure provides that the force sensors are arranged on the opposite side of the housing of the force measurement module with respect to the screw dome and/or screw channel into which the screws are screwed. During the screwing process, concentrated stresses form around the screw dome and/or the screw channels which are transferred onto the battery module and/or onto the battery housing and produce internal stresses. Within the meaning of the present disclosure also provides for arranging the force sensors in the regions of the force measurement module in which the greatest internal stresses are expected during the pressing and screwing process.

In addition, the force measurement module comprises at least one heat exchanger, in one variation, a ventilator which dissipates the heat from the force measurement module that is produced during operation. This will also provide that the temperature of the force measurement module will not affect the measurement of the force sensors and can be adjusted to the temperature during the pressing and screwing of the battery module, so that no additional temperature-induced forces occur during the measurement due to the force measurement module in comparison to the pressing and screwing of the associated battery module.

Furthermore, the force sensor can be arranged in a base surface and placed into the battery housing. Also, a plurality of force sensors can be arranged in the base surface. The force sensor can be arranged at the base surface by means of a shoulder screw. The force sensor can be attached to the middle part of the force measurement module. In addition, the force sensor can feature a hardened surface. When measuring the forces, the weight of the force sensor and/or of the force measurement module is not taken into account during the measurement so that exclusively the forces and force-changes actually occurring due to the pressing and/or screwing are measured.

According to one variation, the force measurement module comprises at least two force sensors which are arranged as spatially distributed in the housing and are each designed to determine the force upon installation of the housing into the battery housing. Due to an arrangement of a plurality of force sensors on the housing, the force can be measured at several locations. Due to the subsequent evaluations, either the forces and force-changes can be evaluated relative to the particular positions of the force sensors, or evaluated by means of mathematical functions relative to certain areas of the force measurement module, in one variation, by averaging the forces at three points across the surface between the three points.

In order to obtain planar parallelity between the base surface and the middle part, the base surface and the middle part can be again milled planar after the assembly of the force measurement module. The material of the contact surface of the sensors with the middle part can be made of wear-resistant and stainless steel. Surfaces where the force measurement module is screwed down, can likewise consist of wear-resistant and stainless steel. In one variation, the cover of the force measurement module can be of aluminum. To keep the weight of the force measurement module as small as possible, the steel can be provided with recesses.

Furthermore, the housing features an arrangement which is designed to screw the force measurement module to the battery housing and/or to a cover, wherein the at least one force sensor is designed to determine a force on the force measurement module when screwing the force measurement module to the battery housing and/or to the cover.

According to another variation, the force measurement module comprises a data processing unit which is designed to determine and evaluate a force sensor signal from the at least one force sensor. The data processing unit can be connected to the measurement amplifier via a data network, in one variation Ethernet. The force sensor signal can be recorded and evaluated in real time by the data processing unit. Likewise, the data processing unit can record and evaluate the chronological force profile during pressing or screwing down of the force measurement module.

In addition, the force measurement module comprises a wireless interface, in one form a WLAN-interface which is designed to transfer data from the force measurement module to an additional data processing unit. In one variation, the additional data processing unit can be an external computer which is controlled by an operator. The wireless interface can be arranged in the middle part of the force measurement module. A signal-transmissive plastic covering shields the wireless interface against damage and contamination. Due to the wireless interface the force measurement module can be conveniently handled by the operator. Likewise, via the wireless interface the measured data from the force measurement module can be sent to an external screw terminal where the screw parameters for the corresponding battery module are automatically preset and then can be used during the semi-automatic or automatic pressing and screwing process.

In accordance with an variation, the force measurement module comprises a receptacle with a power supply which is designed to supply electrical energy to the force measurement module. In one variation, the power supply can be a replaceable storage battery. The storage battery can supply a voltage, in one form of 12 volts, to the force measurement module. In addition, the force measurement module can be operated, in one variation, from the power mains. The heat exchangers can be arranged side by side at the replaceable storage battery. A warning signal, in one variation, an indicator lamp or a warning display, can notify the user when the storage battery needs to be replaced. This can inhibit the force measurement module from having to interrupt the measurement due to deficient power supply.

An additional aspect of the present disclosure relates to a method for determining a force when installing a battery module into a battery housing, with provision of a force measurement module with a housing which has essentially the external dimensions of the battery module, and at least one force sensor which is arranged in the housing and is designed to determine a force when installing the housing into the battery housing, and instead of the battery module, installing of the force measurement module into the battery housing wherein the force sensor determines the force when installing.

In one variation, the force measurement module can be installed into the battery compartment of the battery housing by using a tool grasper. Before installing of the force measurement module, a heat conducting medium, such as a gap filler in one variation, can be applied into the battery compartment. The force measurement module can then be pressed into the battery compartment.

In one variation of the present disclosure, the shape and external dimensions of the particular battery module to be installed are measured, and the shape and external dimensions of the housing of the force measurement module are adapted to the shape and external dimensions of the particular battery module to be installed. In this regard in one form the base, cover and/or the side walls of the force measurement module are pushed against each other and locked in place in such a manner that a flexible adaptation to different shapes and external dimensions of the housing of the force measurement module will be possible. The adjusting of the shape and external dimensions of the housing can be handled manually by an operator by locking the mountings onto the particular bar and/or by electrical servo-motors using an electrical control.

In one variation, the force measurement module can feature three force sensors which are arranged as spatially separated in the base surface and determine the force when pressing down the force measurement module. The measured values can then be recorded and analyzed by the data processing unit. After determining of the force, the force measurement module can be removed from the battery compartment by using the tool grasper and a battery module can be installed into the battery compartment.

Furthermore, a force produced when screwing the installed force measurement module onto the battery housing and/or to a cover will be determined. Screwing down the battery module, based on the determined forces and force-changes in the force measurement module, can proceed via the tool grasper or a screw terminal.

Furthermore, in addition to a measurement and evaluation of pressing and screw-down forces, a wetting of the heat conducting medium in the battery compartment during the pressing and screwing of the force measurement module can be analyzed.

According to one variation of the present disclosure, the installed force measurement module can be removed, and the battery module installed into the battery housing, under consideration of the previously measured forces at the installed force measurement module. The battery module can be installed with the tool grasper.

Additional features, advantages and details of the present disclosure are indicated in the following description of a form of the present disclosure, and based on the drawings. The features and feature combinations named in the description above, and also the features and feature combinations depicted in the following description of figures and/or in the figures themselves, can be employed not only in the stated combination, but rather also in other combinations or individually, without leaving the scope of the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
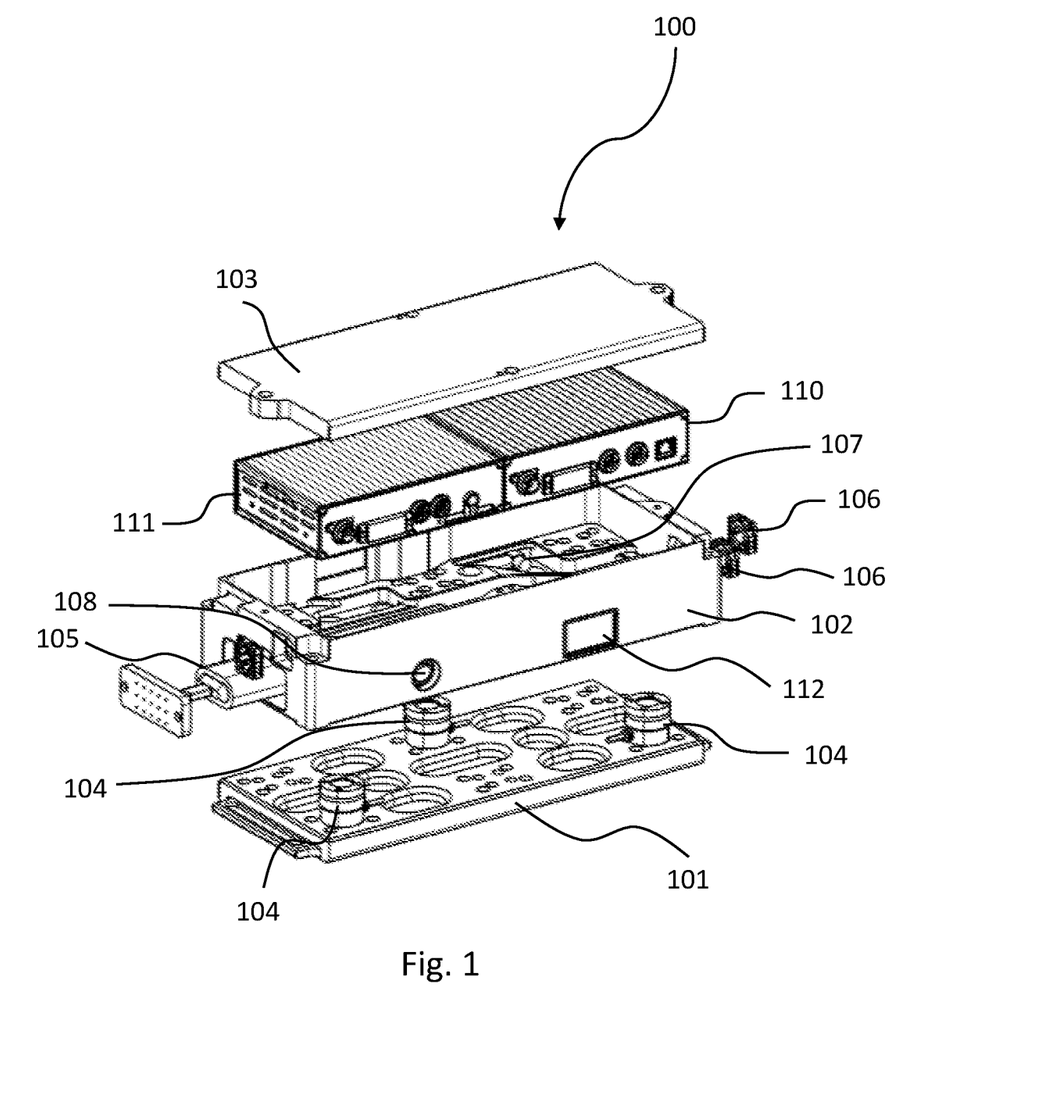
FIG. 1 is an exploded representation of a force measurement module, according to the teachings of the present disclosure.

FIG. 1 depicts a force measurement module according to a first variation of the present disclosure in an exploded representation.

The force measurement module 100 comprises a base surface 101. According to the first variation, the base surface is connected to a middle part 102 by means of three force sensors 104. The three force sensors 104 are arranged in a triangular shape on the base surface 101 and are attached to the middle part 102. Within the scope of an evaluation of the forces and force-changes measured by the force sensors 104, a spatial stress distribution can be calculated, based on an averaging of the particular forces and force-changes with respect to the surface in between and with respect to the positions of the force sensors 104. In an additional variation, more than three force sensors 104 are arranged on the base surface 101 in a different spatial distribution, wherein the most different spatial distributions are possible and enable corresponding methods of evaluation at the positions of the force sensors 104.

A replaceable storage battery 105 is arranged on the middle part 102 and supplies the force measurement module 100 with electric power. A warning display 112 which is likewise arranged on the middle part 102, indicates when the storage battery 105 needs to be replaced. Two ventilators as heat exchangers 106 are likewise arranged on and attached to the middle part 102. In an additional variation of the present disclosure, more than two ventilators 106 are attached to the middle part 102. The ventilators 106 shield the force measurement module 100 against overheating and dissipate the heat generated during operation, or keep the temperature of the force measurement module 100 to a predetermined temperature; in one form to the temperature of the associated battery module 113 (not illustrated in FIG. 1) during the pressing and screwing process.

In addition, an on/off flip switch 108 and a wireless interface 107 are arranged on the middle part 102. The on/off flip switch 108 is used to switch the force measurement module 100 on and off; one form within the scope of an automated installation of the force measurement module 100 into a battery housing. According to the first variation, the wireless interface 107 is a WLAN interface. The force measurement module can be connected to an external data processing unit over the wireless interface 107.

Furthermore, an additional data processing unit 111 is built into the middle part 102 and is connected to a measurement amplifier 110 over a data network. The data processing unit 111 records the measured values measured by the particular force sensors 104 in real time, analyzes them and calculates the resulting forces and/or force-changes. Based on the calculated forces and/or force-changes, information is derived about the quality and occurring internal stresses when pressing down and screwing on the force measurement module 100. The measurement amplifier 110 is likewise arranged on the middle part 102. The measurement accuracy of the force sensors 104 is increased by the measurement amplifier 110.

The force measurement module 100 further comprises a cover 103 which shields the force measurement module 100 against damage and contamination.

Figure 2:
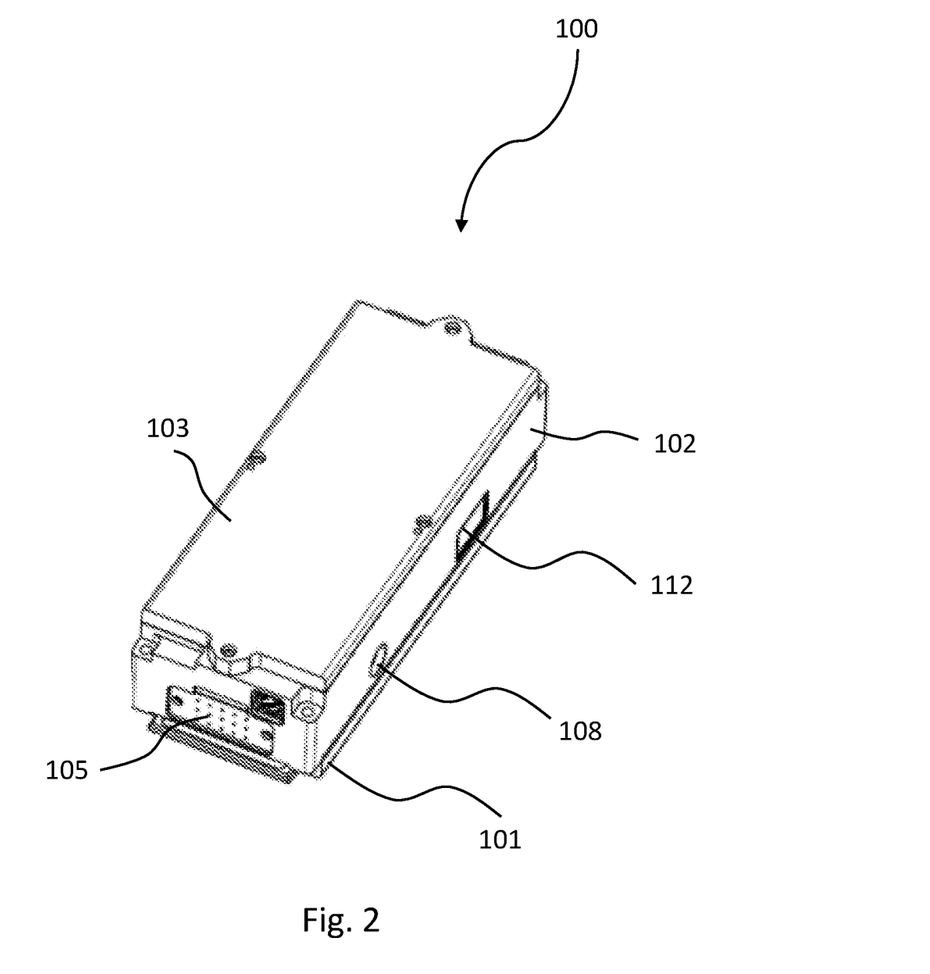
FIG. 2 is a perspective representation of a force measurement module of a first variation, according to the teachings of the present disclosure.

FIG. 2 depicts the force measurement module 100 in a perspective representation according to the first variation.

The base surface 101, the middle part 102 and the cover 103 of the force measurement module 100 are secured by means of screws. The housing of the force measurement module 100 corresponds to the shape and external dimensions of the battery module 113 to be installed.

Figure 3:
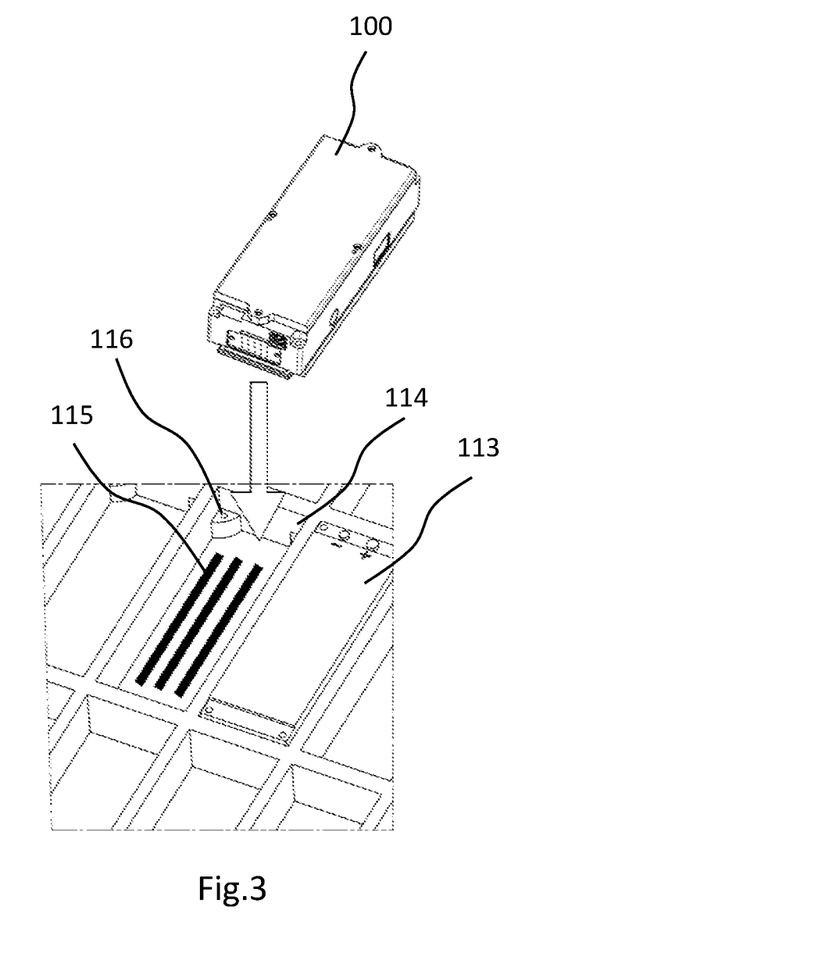
FIG. 3 is a perspective representation of a force measurement module with a battery compartment of the first variation, according to the teachings of the present disclosure.

FIG. 3 depicts the force measurement module 100 with a battery compartment 114 according to the first variation in a perspective illustration.

The base surface 101 of the force measurement module 100 is mounted in a floating manner in the battery compartment 114, since a gap filler 115 is applied in the battery compartment 114 before pressing in the force measurement module 100. In one variation, the gap filler 115 is applied in a strip shape onto the base of the battery compartment 114. The battery compartment 114 comprises a plurality of screw-down lashings 116. The force measurement module 100 is screwed onto the battery housing with the aid of the screw-down lashings. Thus the force measurement module 100 can be installed each individually into an associated battery compartment 114, so that immediately thereafter the associated battery module 113 is pressed into and screwed into the force measurement module 100 under consideration of the measured forces and force-changes. This procedure provides that the interior stresses inside the associated battery module 113 of the particular battery compartment 114 are reduced. Alternatively the present disclosure provides that in a first step, all battery compartments 114 of the battery housing are each populated with force measurement modules 100 and screwed down and then the force measurement modules 100 are again removed individually from the battery compartments 114 and replaced by associated battery modules 113, wherein the particular battery module 113 is pressed down and screwed down based on the measured forces and/or force-changes of the force measurement module 100 allocated to the particular battery compartment 114. The advantage of this procedure is that the interior stresses inside the entire battery housing are reduced, and not only relative to a particular battery compartment 114.

Figure 4:
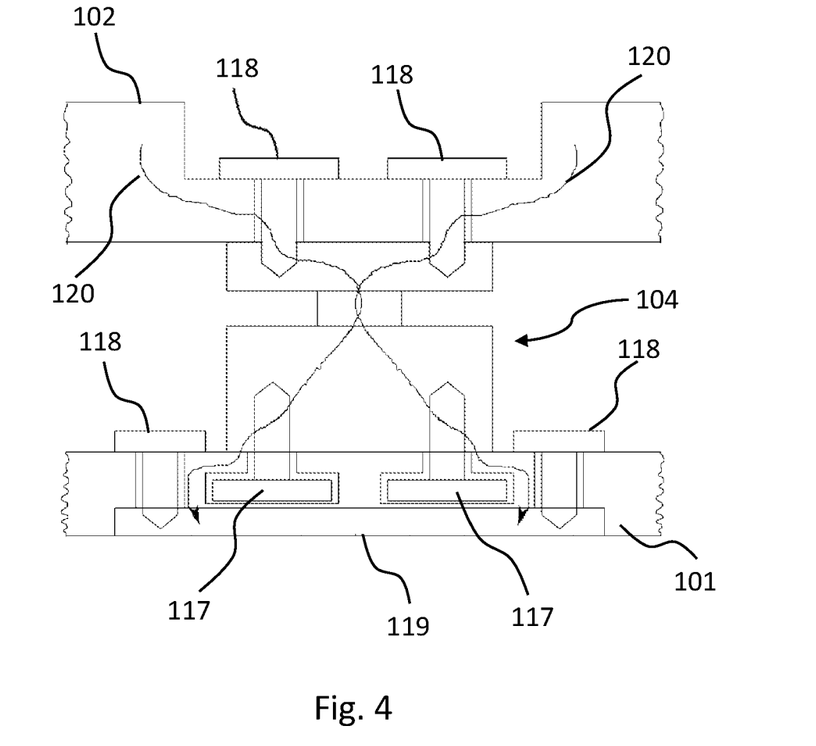
FIG. 4 is a schematic representation of a base surface with a force sensor and a middle part during the press-down of the force measurement module, according to the teachings of the present disclosure.

FIG. 4 depicts a cross-sectional representation of the base surface with the force sensor 104 and the middle part 102 according to a second variation during the pressing of the force measurement module 100.

The force sensor 104 is attached with screws 118 to the middle part 102. According to the second variation, the base surface 101 comprises a cover 119. In addition, the force sensor 104 is secured with shoulder screws 117 to the base surface 101. Only the tip of the screw neck of the shoulder screw 117 has threading. The remaining portion of the screw neck features a smooth surface, so that the shoulder screw 117 can be moved linearly in a screw hole. The base surface 101 is attached to the middle part 102 only by means of the shoulder screws 117 and the force sensor 104. When pressing down the force measurement module 100, the shoulder screw 117 is pressed into the screw hole. Likewise in FIG. 4 the flow of force 120 during the pressing of the force measurement module 100 is illustrated in the form of lines. The forces are transferred via the screws 118 and the force sensor 104.

Figure 5:
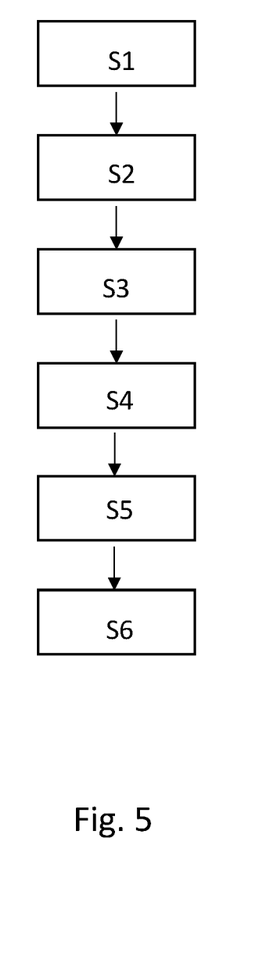
FIG. 5 is a schematic representation of a method for determining a force when installing a battery module into a battery housing, according to the teachings of the present disclosure.

FIG. 5 provides a schematic illustration of a method for determining a force when installing a battery module into a battery housing.

In a first step (S1) the force measurement module 100 is made ready with the housing. The force measurement module 100 has the shape and external dimensions of the battery module 113 or is adapted to the shape and external dimensions of the particular battery module to be installed.

In a second step (S2) a gap filler 115 is applied to the base surface of the battery compartment 114.

In a third step (S3) the force measurement module 100 is installed into the battery compartment 114 of the battery housing. The force measurement module 100 is installed into the battery compartment 114 by using a tool grasper.

In a fourth step (S4) the forces and/or the force-changes upon installing the force measurement module 100 into the battery compartment 114 are determined by the force sensors 104. The force measurement module 100 experiences a compression force when installed into the battery compartment 114. According to this variation, three force sensors 104 are arranged on the base surface 101 of the force measurement module 100. The individual forces and/or force-changes of the particular force sensors 104 are measured. The data processing unit 111 records the measured value in real time and calculates the resulting force when pressing the force measurement module 100 into the battery compartment 114.

In a fifth step (S5) the forces occurring when screwing on the force measurement module 100 to the battery housing and at one cover of the battery housing are determined by the force sensors 104. In an additional variation the forces are determined when screwing the force measurement module 100 to the battery housing or to one cover of the battery housing.

In a sixth step (S6) the force measurement module 100 is removed from the battery compartment 114 using a tool grasper and then the battery module 113 is installed into the battery housing. The values previously measured by the force sensors 104 of the force measurement module 100 are taken into account when installing the battery module.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A force measurement module for determining of a force when installing a battery module into a battery housing, the force measurement module comprising:
   a module housing having a shape and a plurality of external dimensions substantially similar to the battery module;
   at least one force sensor arranged in the module housing and configured to generate a force sensor signal based on a force acting on the force measurement module; and
   a data processing unit disposed within the module housing configured to determine the force acting on the force measurement module when installing the module housing into the battery housing based on the force sensor signal.

2. The force measurement module according to claim 1, wherein the shape and the plurality of external dimensions of the module housing are adaptable.

3. The force measurement module according to claim 1 wherein the at least one force sensor includes at least two force sensors arranged as being spatially distributed in the module housing and each is configured to determine the force when installing the module housing into the battery housing.

4. The force measurement module according to claim 1, wherein the module housing comprises a device configured to screw the force measurement module to at least one of the battery housing or a cover, wherein the at least one force sensor is configured to determine the force on the force measurement module when screwing the force measurement module to the at least one of the battery housing or the cover.

5. The force measurement module according to claim 1, further comprising a wireless interface comprising a WLAN-interface, wherein the WLAN-interface is configured to transmit data from the force measurement module to an additional data processing unit.

6. The force measurement module according to claim 1, further comprising a receptacle with a power supply configured to supply electrical energy to the force measurement module.

7. A method for determining a force when installing a battery module into a battery housing, the method comprising:
   provisioning of a force measurement module, wherein the force measurement module includes a module housing having external dimensions similar to the battery module and at least one force sensor arranged in the module housing and configured to generate a force sensor signal based on the force acting on the force measurement module;
   installing the force measurement module into the battery housing; and
   determining, by a data processing unit disposed within the module housing the force acting on the force measurement module when installing the force measurement module into the battery housing based on the force sensor signal.

8. The method according to claim 7, wherein the force is determined when the force measurement module is being screwed into at least one of the battery housing or a cover.

9. The method according to claim 7, further comprising:
   adapting a shape and the external dimensions of the module housing before installing of the force measurement module into the battery housing.

* * * * *